United States Patent [19]

Aoki et al.

[11] 3,746,943

[45] July 17, 1973

[54] SEMICONDUCTOR ELECTRONIC DEVICE

[75] Inventors: Masaharu Aoki, Tokyo; Hiroyuki Kasano, Akishima; Kazuhiro Kurata, Hachioji; Masahiko Ogirima, Tokyo, all of Japan

[73] Assignee: Hitachi, Ltd., Tokyo, Japan

[22] Filed: June 29, 1970

[21] Appl. No.: 50,870

[30] Foreign Application Priority Data

June 30, 1969 Japan ................................ 44/51609

[52] U.S. Cl. ...... 317/234 R, 317/234 V, 317/235 N, 317/235 AQ, 331/107 G

[51] Int. Cl. ............................................. H01l 15/00

[58] Field of Search ................. 317/235 N, 235 AQ, 317/234 V; 331/107 G

[56] References Cited

UNITED STATES PATENTS

| | | | |
|---|---|---|---|
| 3,387,163 | 6/1968 | Queisser | 313/108 |
| 3,560,275 | 2/1971 | Kressel et al. | 148/171 |
| 3,427,211 | 2/1969 | Foster et al. | 148/171 |
| 3,581,232 | 6/1968 | Murayama | 331/107 |

OTHER PUBLICATIONS

"Electronics," Mar. 4, 1968; page 109 relied on.

Day, G. F., New Gunn Effect Materials, "Technical Report," AFAL-TR-67-2, March, 1967.

*Primary Examiner*—Martin H. Edlow

*Attorney*—Craig, Antonelli & Hill

[57] ABSTRACT

A semiconductor electronic device having an n-type semiconductor body obtained by doping a crystal of a group III-V compound semiconductor with germanium to form a shallow donor level of germanium therein so that this shallow donor level is utilized for radiating electroluminescence or producing bulk oscillation, and a method of fabricating such a crystal by the epitaxial growth of the crystal on one surface of a germainum substrate whose opposite surface is coated with a GaP layer.

1 Claim, 6 Drawing Figures

INVENTORS

MASAHARU AOKI, HIROYUKI KASANO, KAZUHIRO KURATA AND MASAHIKO OGIRIMA

BY Craig, Antonelli, Stewart & Hill
ATTORNEYS

SEMICONDUCTOR ELECTRONIC DEVICE

BACKGROUND OF THE INVENTION

1. Field of the Invention

This invention relates to a semiconductor electronic device which employs a germanium-doped GaP crystal or a germanium-doped mixed crystal of a group III-V compound semiconductor containing GaP, and relates also to a method of fabricating such a crystal.

2. DESCRIPTION OF THE PRIOR ART

Priorly appreciated donors for the groups III–V compound semiconductors include the group VI elements such as oxygen, sulfur and tellurium. Besides these elements, the group IV elements are also usable as donors for these compound semiconductors. However, the group IV elements do not necessarily act as donors depending on the kind of elements, the kind of host crystals doped therewith and the condition of doping. When, for example, a crystal of GaP which is preferred as a material of a light emitting diode is doped with carbon, carbon replaces phosphorus so as to act as an acceptor. When, on the other hand, this same host crystal is doped with silicon, silicon replaces phosphorus and gallium so as to act as an acceptor and a donor, respectively. In this case, silicon behaves as an amphoteric impurity.

It has heretofore been considered that germanium acts as a donor and an acceptor occupying a deep energy level when a crystal of GaP is doped with germanium. Thus, in a light emitting diode employing GaP doped with germanium, radiation of visible light having wavelengths shorter than that of red light by the addition of the germanium dopant has been considered impossible since the germanium dopant occupies a deep level as described above. Further, in view of the segregation coefficient, doping of germanium into the crystal of GaP is relatively difficult. For these reasons, the crystal of GaP doped with germanium has not been employed as a material of an electroluminescent diode.

SUMMARY OF THE INVENTION

The inventors have discovered that, in the course of epitaxial growth of a GaP layer on a germanium substrate, a large amount of germanium is doped from the substrate into the grown layer by the mechanism of autodoping thereby forming an n-type layer therein, and a p-n junction diode made from this grown layer emits visible rays.

It is an object of the present invention to provide an electroluminescent device employing a germanium-doped GaP crystal.

Another object of the present invention is to provide an electroluminescent device employing a germanium-doped group III-V compound semiconductor crystal containing GaP.

Still another object of the present invention is to provide a bulk oscillation device employing a crystal of the kind described above.

A further object of the present invention is to provide a method of fabricating a crystal of the kind described above which employs an inexpensive germanium substrate and in which the amount of germanium used for doping can be easily controlled.

In accordance with one aspect of the present invention, there is provided a solid-state electronic device comprising an element body made of a group III–V compound semiconductor crystal containing GaP, said crystal containing a germanium dopant which forms a shallow donor level therein, said element body having a pair of electrodes in ohmic contact with the opposite surfaces of said crystal, and a biasing voltage source connected with said electrodes for causing the electrons excited from said shallow level to drift in said crystal.

Other objects, features and advantages of the present invention will be apparent from the following detailed description of some preferred embodiments thereof taken in conjunction with the accompanying drawings.

DESCRIPTION OF THE PREFERRED EMBODIMENTS

At first, a first embodiment of the present invention will be described in which a layer of a GaP crystal doped with germanium is epitaxially grown on a single-crystalline substrate of GaAs, this layer being used to make a p-n junction diode, and a forward biasing voltage is applied to the diode for causing emission of visible rays therefrom.

Figures 1A, 1B:
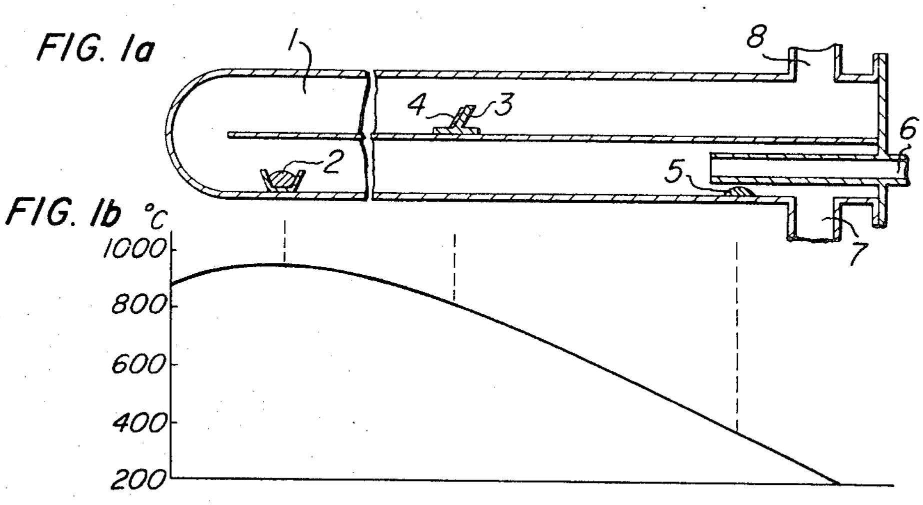
FIG. 1*a* is a longitudinal sectional view of a two-stage reactor tube for growing a crystal employed in a few embodiments of the present invention.
FIG. 1*b* is a graph showing the temperature distribution in the reactor tube shown in FIG. 1*a*.

Referring to FIGS. 1a and 1b, there are shown a longitudinal sectional view of a two-stage quartz reactor tube used for the epitaxial growth and a graph showing the temperature distribution within the tube during the expitaxial growth, respectively. The reactor tube 1 is preliminarily cleaned and dried. A source 2 consisting of a mixture of 0.35 gram of red phosphorus and 6 grams of gallium, a single-crystalline substrate of GaAs 4 supported on a carrier 3 of quartz, and a mass of high-purity red phosphorus 5 in an amount of 3 grams are dispoded within the reactor tube 1 in the illustrated positions. The GaAs substrate 4 is preliminarily doped with tellurium of a concentration of $10^{18}$ $cm^{-3}$ and is thus an n-type single crystal, and a layer of GaP is epitaxially grown on this substrate 4. Further, the substrate 4 is preliminarily cut so that the surface thereof coincides with the (100) plane, and this surface is polished to a mirror finish by means of alumina. Moreover, immediately before insertion into the reactor tube 1, the substrate 4 is etched by a 1:1 mixture of $H_2O$ and $H_2SO_4$ to remove the strain as well as contamination.

The reactor tube 1 is placed in an electric furnace (not shown) having a suitable temperature gradient therein, and a stream of refined hydrogen is passed through the reactor tube 1 for about 30 minutes at a flow rate of 300 cc per minute to replace the air within the reactor tube 1 by hydrogen. Thereafter, electrical power is supplied to the electric furnace to raise the temperature of the reactor tube 1. By suitably controlling the temperature gradient in the electric furnace and the current supplied to the electric furnace, the temperature distribution within the reactor tube 1 can be maintained in a manner as shown in FIG. 1*b*, from which it will be seen that the source 2, the substrate 4 and the mass of red phosphorus 5 are heated to 950° C, 800° to 850° C, and 370° to 400° C, respectively.

A mass of $PCl_3$ is placed in another quartz vessel (not shown) which is kept at 0° C and connected at one end to a gas inlet 6 and at the other end to a source of hydrogen. Hydrogen is supplied into this quartz vessel from the hydrogen source at a flow rate of 50 cc per minute and a stream of hydrogen saturated with $PCl_3$ is introduced into the reactor tube 1 through the gas inlet 6. A stream of hydrogen containing 0.01 mol % $GeH_4$ is further introduced into the reactor tube 1 through another gas inlet 7 at a flow rate of 50 cc per minute. The gases introduced into the reactor tube 1 through the gas inlets 6 and 7 are discharged outwardly through a gas outlet 8. The heating and introduction of gases are continued for about 5 hours, and then the supply of gases is ceased and the temperature is lowered.

A layer of GaP about 250 $\mu$ thick grows on the substrate 4 by the above treatment. The grown layer is brownish in appearance, and germanium is doped in this layer in a concentration of about $9 \times 10^{17}$ $cm^{-3}$ so that this layer has an n-type conductivity. The substrate portion is removed by grinding to obtain a crystal piece of GaP about 180 $\mu$ thick, and the crystal piece is etched by a 1:1 mixture of HCl and $H_2O_2$ to remove any strain. This crystal piece is enclosed in a quartz ampule together with zinc and phosphorus and the ampule is evacuated to a vacuum of about $10^{-5}$ Torr. The ampule is kept at a temperature of 850° C for about 30 minutes to duffuse zinc into the crystal piece so as thereby to obtain a p-n junction. The crystal piece is taken out of the ampule and one of its surfaces is removed by about 50 $\mu$ by grinding. Nickel is plated on the ground furface. A pellet of a size of 1 $mm^2$ is cut out from the crystal piece treated in the manner described above.

Figure 2:
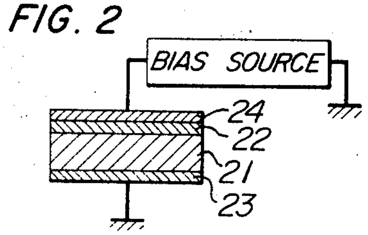
FIG. 2 is a schematic partly sectional view of an electroluminescent device embodying the present invention and a connection diagram thereof.

Referring to FIG. 2, there is shown a connection diagram of an electroluminescent device employing the pellet described above, with part of the device shown in section. A layer 22 covering the surface of the single crystal of GaP 21, which is doped with germanium and therefore shows an n-type conductivity, is converted into p-type due to the diffusion of zinc, and thus a p-n junction if formed between the layers 21 and 22. The surface of the layer 21 opposite to the surface having the p-type layer 22 is plated with nickel to provide an electrode 23. An indium electrode 24 is provided on the surface of the p-type layer 22. The electrodes 23 and 24 are in ohmic contact with the respective layers 21 and 22. When the electrodes 23 and 24 are connected to a biasing source and a forward current of about 5 mA is applied across the electrodes 23 and 24, uniform light of orange-yellow color is emitted principally from the p-type layer 22.

The emission spectrum has two marked peaks at about 7,000 A and 5,700 A. The peak at 7,000 A coincides with a well known peak due to the recombination radiation of electrons trapped by the oxygen donor and holes trapped by the zinc acceptor. The oxygen is doped into the crystal in the course of the growth of the crystal as it is present in the reactor tube in the form of a decomposition product of the wall of the quartz reactor tube or an impurity in the gases introduced into the reactor tube.

With regard to the peak appearing at 5,700 A, an investigation on the process of the growth of the crystal has reached a conclusion that the peak is attributable to the doped germanium. Further, in a conventional diode obtained by diffusing zinc into tellurium-doped GaP, a peak of luminescence due to the electronic transition between tellurium establishing a shallow donor level and zinc which is an acceptor appears also at 5,700 A. For the two reasons described above, it is construed that germanium establishes a shallow donor level in GaP like tellurium and the electronic transition between germanium and the zinc acceptor emits the recombination radiation whose peak appears at 5,700 A.

As described previously, the luminescence occurs principally in the p-type layer 22. Thus, in the structure shown in FIG. 2, the luminescence having the peak at 5,700 A is produced by the fact that the electrons thermally excited to the conduction band from the germanium donor level in the n-type layer 21 are caused to drift into the p-type layer 22 by the action of the biasing source, are trapped into the germanium level in the p-type layer 22 and recombine with the holes trapped by the zinc acceptor thereby emitting the recombination radiation. Although the marked peak appearing at 5,700 A has been solely referred to in the above in order to prove the fact that germanium establishes the shallow donor level in GaP, detailed observation of the emission spectrum proves also the fact that other peaks of luminescense due to the germanium donor are present at 6,780 A and 8,000 A. The relative intensity of the three peaks related with the germanium donor varies depending upon the amount of germanium doped. Therefore, the color of luminescence can be varied between red and yellow by varying the amount of $GeH_4$ in the hydrogen stream introduced into the reactor tube during the epitaxial growth of GaP.

A second embodiment of the present invention will be described hereunder in which a mixed crystal in the form of $GaP_xAs_{1-x}$ $(0.4 < x < 1)$ doped with germanium is epitaxially grown on a substrate of GaAs and this mixed crystal is used for making an electroluminescent device.

In the step of epitaxial growth of the crystal in the case of the first embodiment, hydrogen saturated with $PCl_3$ has been introduced from the gas inlet 6 at a flow rate of 50 cc per minute. In the second embodiment, a stream of hydrogen saturated with $PCl_3$ and flowing at a rate of 10 cc per minute is joined with a stream of hydrogen flowing at a rate of 40 cc per minute through another quartz tube kept at 25° C and containing therein $AsCl_3$, and the joined stream is introduced into the reactor tube 1 from the gas inlet 6. Other steps of crystal growth are similar to those in the first embodiment. In about 5 hours, a mixed crystal in the form of $GaP_{0.43}As_{0.57}$ doped with germanium and having a thickness of about 200 $\mu$ grows on the substrate of GaAs.

The mixed crystal grown on the substrate is treated in a manner similar to the case of the first embodiment thereby to form a p-n junction diode and a biasing source is connected to the diode to obtain an electroluminescent device. When a forward current was supplied to the device, the device emitted red light. The spectrum in the visible range of the luminescence shows a marked peak at about 6,700 A. As is commonly known, a mixture of a crystal of GaP and a crystal of GaAs gives a narrowed band gap, and as a result, the energy difference between the doped germanium level and the zinc level as well as the energy difference between the oxygen level and the zinc level is reduced. Therefore, the luminescence due to the electronic transition between oxygen and zinc is shifted to the infrared range, and the luminescence due to the electronic transition between germanium and zinc is shifted toward longer wavelength than in the case of GaP, thereby producing a peak at about 6,700 A. It will be seen from the above description that a mixed crystal in the form of $GaP_xAs_{1-x}$ doped with germanium produces also luminescence lying in the visible spectrum range due to the presence of germanium in the shallow donor level.

The first and second embodiments have proved the fact that the shallow donor level of germanium doped in the layers of GaP and $GaP_xAs_{1-x}$ epitaxially grown on a substrate of GaAs is effective for emission of visible rays. However, the single crystal of GaAs used as the substrate is not an inexpensive material at present.

A few embodiments described hereunder relate to an electronic device employing a germanium-doped group III–V compound semiconductor epitaxially grown on a substrate of germanium.

At first, a third embodiment of the present invention will be described in which GaP is epitaxially grown on a single-crystalline substrate of germanium and a p-n junction diode made of this epitaxially grown layer is utilized for the emission of visible rays.

Referring to FIGS. 1*a* and 1*b* again, the substrate carrier 3 is displaced rightward to a position at which the termperature of the substrate 4 shows 780° C. The substrate 4 in this case is a single crystal of n-type germanium containing phosphorus in a concentration of $10^{18}$ $cm^{-3}$. The single crystal of n-type germanium is ground at one surface coinciding with the (111) plane to provide a cyrstal growing surface, and the opposite surface is covered with a silicon dioxide film about 5,000 A thick.

During the epitaxial growth of GaP within the reactor tube 1, a stream of pure hydrogen not containing $GeH_4$ is introduced from the gas inlet 7. Other treatment for the crystal growth is similar to that in the first embodiment. In this case, therefore, no germanium dopant is introduced into the reactor tube 1 from the outside. By the above treatment, a layer of GaP about 340 $\mu$ thick grows on the substrate of germanium 4 in about 5 hours. The layer of GaP thus grown includes a large amount of germanium and is black and opaque. In the course of the above treatment, the silicon dioxide film covering the back surface of the substrate of germinium 4 is etched by the halogen vapor so that germanium in a large amount is vaporized within the reactor tube 1 from the back and side surfaces of the substrate 4. The germanium vapor thus produced is doped into the layer of GaP under growth. That is to say, doping of a large amount of germanium is accomplished by autodoping. The crystal growth in the presence of such a large amount of germanium vapor proceeds according to the so-called VLS (vapor-liquid-solid) process, and thus the grown layer contains germanium in a very large amount which is almost equal to the solid solubility limit thereof. Since such a large amount of germanium is doped into both the donor site and the acceptor site of the growing crystal of GaP, compensation takes place between the donor and the acceptor. As a result, the carrier concentration is of the order of 5 to 8 × $10^{18}$ $cm^{-3}$ at the most in spite of the fact that germanium exists in a large amount. The carrier concentration described above does not substantially vary even when the temperature of the substrate during the crystal growth may be varied in the range of 760° to 810° C. Therefore, it is difficult to control the germanium donor in the case of the growth of the crystal of GaP in the manner described above.

The grown layer of GaP containing germanium in a large amount is treated in a manner similar to the treatment carried out in the first embodiment to form a p-n junction diode. When the p-n junction diode is connected to a biasing source and a forward current is supplied thereto, the device emits green light whose spectrum shows a marked peak at about 5,700 A. In this case too, the shallow donor level of germanium participates in the luminescence.

The back surface of the substrate in the crystal piece consisting of the substrate of germanium and the grown layer of GaP obtained by the crystal growth treatment described above is ground to remove any remaining portions of the silicon dioxide film as well as uneven portions of the exposed germanium surface due to vaporization of germanium, and the ground surface is further polished to a mirror finish. The resultant crystal piece structure consisting of the substrate of germanium and the grown layer of GaP is employed as a substrate, and the same process of crystal growth as that described previously is carried out to cause epitaxial growth of a crystal of GaP on this substrate again. In this case, the mirror surface of the germanium substrate is the crystal growing surface, and the previously grown layer of GaP containing germanium in a large amount is the coating layer for the germanium substrate. By this crystal growth, a layer of GaP bearing a color of red-orange or red-brown grows on the germanium substrate.

According to this crystal growth process, the coating layer which is the layer of GaP prevents the autodoping of germanium from the back surface of the germanium substrate, and the doping of germanium into the grown layer is effected by germanium escaping from the substrate surface and germanium porduced by the decomposition of the coating layer. Because of this manner of doping, the amount of germanium doped into the grown layer is not so large compared with the case of the autodoping. Further, according to this process, the amount of germanium doped, hence the carrier concentration is easily and accurately controlled by controlling the temperature of the substrate. The carrier concentration in a deep portion of the grown GaP layer remote from the peculiar region near the surface of the substrate was measured. According to the results of measurement taken at a point spaced 150 $\mu$ from the substrate surface, the carrier concentrations relative to the temperature of the substrate of 780° C, 800° C and 820° C were a 2 × $10^{17}$ $cm^{-3}$, 7 × $10^{17}$ $cm^{-3}$ and 1 × $10^{18}$ $cm^{-3}$, respectively. The grown layer of GaP obtained by this method shows a satisfactory degree of crystallization, and a p-n junction diode made from this grown layer by treatment similar to that described previously emits very bright light ranging from orange to green depending on the amount of germanium doped.

It will thus be understood that the method of epitaxially growing a layer of GaP on a germanium substrate whose back surface is coated with a coating layer of GaP containing germanium in a large amount is advantageous from the economical aspect due to the fact that germanium which is far less expensive than GaAs is used as the substrate. Another advantage resides in the fact that the amount of germanium doped can be easily and accurately controlled by merely simply varying the position of the substrate within the reactor tube thereby varying the temperature of the substrate and that the color of light emitted can be controlled by varying the amount of germanium doped. A further advantage resides in the fact that the crystal of GaP thus grown has a satisfactory degree of crystallization and a p-n junction diode made from the crystal emits light having a very high brightness.

A fourth embodiment of the present invention described hereunder employs a mixed crystal in the form of $GaP_xAs_{1-x}$ epitaxially grown on a germanium substrate. Like the third embodiment, a layer of GaP containing germanium in a large amount due to the autodoping is at first grown on a germanium substrate. The crystal piece consisting of the germanium substrate and the GaP layer is used as a substrate for the growth of a mixed crystal. The back surface of the germanium substrate is ground and polished to a mirror finish to provide the mixed crystal growing surface, and the GaP layer is used as the coating layer.

As in the case of the second embodiment, a stream of hydrogen containing $PCl_3$ and a stream of hydrogen containing $AsCl_3$ are introduced into the reactor tube to cause a layer of $GaP_xAs_{1-x}$ to grow on the substrate, In this embodiment, however, pure hydrogen is used in lieu of hydrogen containing $GeH_4$, and germanium produced by the decomposition of the coating layer is utilixed for doping of germanium into the mixed crystal layer. The flow rate of the hydrogen stream containing $PCl_3$ relative to the flow rate of the hydrogen stream containing $AsCl_3$ may be suitably varied so that the mixed crystal in the form of $GaP_xAs_{1-x}$ has any desired value of $x$. The mixed crystal thus grown is subjected to treatment similar to that described previously thereby to form a p-n junction diode therefrom. When this p-n junctin diode is connected to a biasing source and a forward current is supplied thereto, light emitted therefrom has a peak due to the presence of the shallow donor level of germanium and this peak is variable depending on the value of $x$.

A fifth embodiment of the present invention employs a mixed crystal in the form of $Ga_xIn_{1-x}P$ epitaxially grown on a germanium substrate.

Figures 3A, 3B:
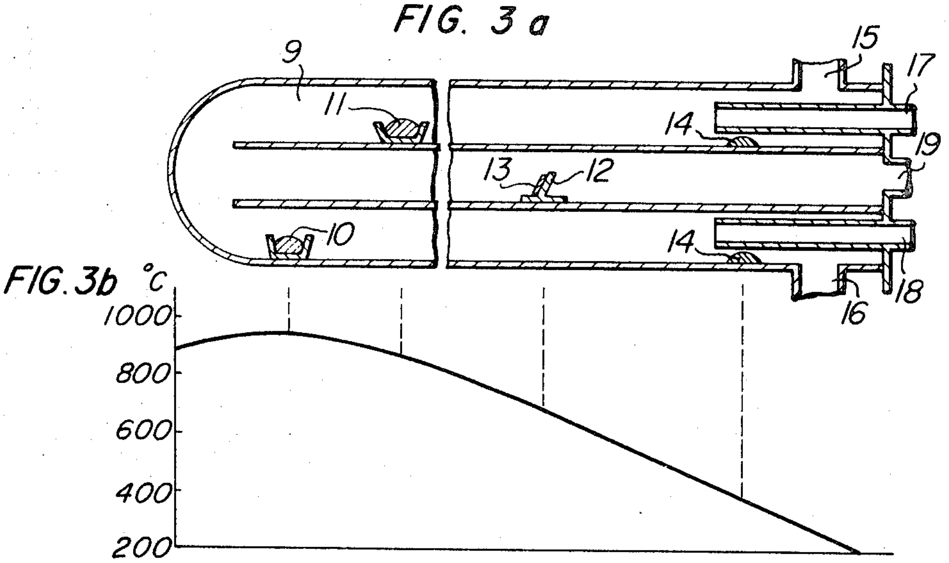
FIG. 3*a* is a longitudinal sectional view of a three-stage reactor tube for growing a crystal employed in another embodiment of the present invention.
FIG. 3*b* is a graph showing the temperature distribution in the reactor tube shown in FIG. 3*a*.

Referring to FIGS. 3*a* and 3*b*, there are shown a longitudinal sectional view of a three-stage reactor tube employed for the growth of the mixed crystal used in this embodiment and a graph showing the temperature distribution whithin the reactor tube, respectively. The reactor tube 9 is preliminarily cleaned and dried. A source 10 at high temperature consisting of a mixture of phosphorus and gallium, a source 11 at low temperature consisting of a mixture of phosphorus and indium, a substrate of germanium 13 supported on a carrier 12 of quartz, and a mass of red phosphorus 14 are disposed within the reactor tube 9 in the illustrated positions. The germanium substrate 13 has its back surface coated with a layer of GaP containing germanium in a large amount as described previously.

The reactor tube 9 is placed in an electric furnace (not shown) having a suitable temperature gradient therein. A stream of pure hydrogen is introduced into the reactor tube 9 from each of gas inlets 15 and 16, while a stream of hydrogen containing $PCl_3$ is introduced into the reactor tube 9 from each of gas inlets 17 and 18, and these streams are discharged out of the reactor tube 9 from a gas outlet 19. After replacing air within the reactor tube 9 by the gas streams thus introduced, electrical power is supplied to the electric furnace to raise the temperature of the reactor tube 9. By suitably controlling the temperature gradient in the electric furnace and the current supplied to the electric furnace, the temperature distribution within the reactor tube 9 is maintained in a manner as shown in FIG. 3*b*, from which it will be seen that the high-temperature source 10, the low-temperature source 11, the substrate 13 and the mass of red phosphorus 14 are heated to 950° C, 870° C, 680° to 720° C, and 370° to 400° C, respectively. The overall flow rate of hydrogen containing $PCl_3$ introduced into the reactor tube 9 is limited to less than 100 cc per minute, while the overall flow rate of pure hydrogen introduced into the reactor tube 9 is limited to less than 120 cc per minute. By the above steps, a mixed crystal in the form of $Ga_xIn_{1-x}P$ $(0 < x < 1)$ grows epitaxially on the germanium substrate 13. The value of $x$ in the above formula can be varied by varying the relative flow rate of the stream of hydrogen containing $PCl_3$ introduced from the gas inlets 17 and 18.

Among mixed crystals of various compositions, a grown layer consisting of a mixed crystal having the composition of $Ga_{0.3}In_{0.7}P$ and doped with germanium of a concentration of $10^{17}$ $cm^{-3}$ is selected and is subjected to treatment similar to that described previously to form a p-n junction diode. When a forward current is applied to this p-n junction diode, it emits light of orange-yellow having a high brightness and the spectrum thereof shows a marked peak at about 6,000 A.

Figure 4:
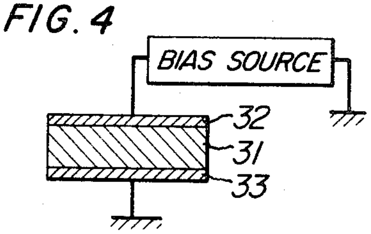
FIG. 4 is a schematic partly sectional view of a bulk oscillation device embodying the present invention and a connection diagram thereof.

A crystal piece which is about 70 $\mu$ thick and has parallel opposite surfaces is cut out from said grown layer having the composition of $Ga_{0.3}In_{0.7}P$, and the opposite surfaces thereof are polished to a mirror finish. Then, as shown in FIG. 4, gold-germanium is evaporated on the opposite surfaces of the crystal piece 31 to provide a pair of electrodes 32 and 33 which are in ohmic contact with the crystal piece 31. A biasing source is connected to these electrodes as shown. When a current is supplied across the crystal piece 31, saturation of current takes place at a field intensity of about 3.5 kilovolts per centimeter and an oscillating current of high frequency is produced. Generation of such a high-frequency oscillating current is observed in the mixed crystals where $x$ lies in the range of $0 < x < 0.7$. It is apparent that the oscillation is produced by such a Gunn effect that the electrons which are excited to the conduction band from the shallow germanium level and are caused to drift within the crystal piece by being urged by the biasing voltage make the intervalley transition due to the energization by the field having the above-described field intensity thereby exhibiting a negative resistance.

While five embodiments of the present invention have been described in detail in the above, the present invention can be summarized as follows: When germanium is doped into a crystal of GaP or a mixed crystal of the group III–V compound semiconductor containing GaP, the germanium establishes a shallow donor level in the crystal so that the crystal shows an n-type conductivity. This donor level can be utilized to obtain an electroluminescent or bulk oscillation device.

Further, in making the germanium-doped crystal, a grown layer of GaP doped with a large amount of germanium by means of autodoping is utilized as the coating layer disposed on the back surface of the germanium substrate, and the crystal is epitaxially grown on the opposite surface of the germanium substrate. The coating layer serves not only as an autodoping preventive layer but also as a suitable source of germanium for doping. Therefore, not only the amount of germanium doped can be easily and accurately controlled by controlling the temperature of the substrate, but also the crystal thus grown shows a satisfactory degree of crystallization and exhibits an excellent performance. Another advantage resides in the fact that the crystal being doped is free from contamination by other undersirable substances since the substances participating in the doping with germanium are germanium forming the substrate and gallium, phosphorus and germanium in the coating layer. Needless to say, the germanium substrate is less expensive than the substrate of GaAs conventionally employed.

Further, the GaP layer serving as the coating layer functions merely to prevent autodoping and provide a source of germanium to be doped. Therefore, in an alternative process, the epitaxial growth of this GaP layer in a manner as shown in the embodiments is unnecessary and this layer may be provided by any other methods including vacuum evaporation of GaP containing a large amount of germanium on the germanium substrate.

While some embodiments of the present invention have been described in detail for the better understanding of the present invention, it will be apparent to those skilled in the art that many changes and modifications may be made therein without departing from the scope of the appended claims and such changes and modifications are also included in the scope of the present invention.

We claim:

1. A semiconductor oscillating device for emitting microwaves comprising:

a Gunn element body made of a single crystal of $Ga_xIn_{1-x}P$ ( $0 < x < 0.7$ ), said single crystal containing homogeneously such a small amount of germanium donors as to exhibit Gunn effect oscillation, said element body having a pair of electrodes in ohmic contact with the opposite surfaces of said single crystal, and a biasing source connected with said electrodes for applying an electric field above the threshold field of said element body, thereby effecting Gunn oscillation.

* * * * *